(12) United States Patent
Elbrecht et al.

(10) Patent No.: US 8,283,999 B2
(45) Date of Patent: Oct. 9, 2012

(54) BULK ACOUSTIC RESONATOR STRUCTURES COMPRISING A SINGLE MATERIAL ACOUSTIC COUPLING LAYER COMPRISING INHOMOGENEOUS ACOUSTIC PROPERTY

(75) Inventors: Lueder Elbrecht, Munich (DE); Robert Thalhammer, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 388 days.

(21) Appl. No.: 12/710,640

(22) Filed: Feb. 23, 2010

(65) Prior Publication Data

US 2011/0204997 A1 Aug. 25, 2011

(51) Int. Cl.
*H03H 9/205* (2006.01)
*H03H 9/54* (2006.01)

(52) U.S. Cl. ......... 333/189; 310/322; 310/334; 310/335

(58) Field of Classification Search ................. 333/189, 333/191; 310/322, 323, 328, 334, 335, 366
See application file for complete search history.

(56) References Cited

U.S. PATENT DOCUMENTS

| | | | | |
|---|---|---|---|---|
| 4,686,409 | A | * | 8/1987 | Kaarmann et al. ............ 310/358 |
| 5,587,620 | A | | 12/1996 | Ruby et al. |
| 5,873,153 | A | | 2/1999 | Ruby et al. |
| 5,974,884 | A | * | 11/1999 | Sano et al. ....................... 73/589 |
| 6,107,721 | A | | 8/2000 | Lakin |
| 6,507,983 | B1 | | 1/2003 | Ruby et al. |
| 6,720,844 | B1 | | 4/2004 | Lakin |
| 6,946,928 | B2 | | 9/2005 | Larson et al. |
| 7,019,605 | B2 | | 3/2006 | Larson, III |
| 7,242,270 | B2 | | 7/2007 | Larson, III et al. |
| 7,280,007 | B2 | | 10/2007 | Feng et al. |
| 7,388,454 | B2 | | 6/2008 | Ruby et al. |
| 7,391,143 | B2 | * | 6/2008 | Bouche et al. ............... 310/327 |
| 7,391,286 | B2 | | 6/2008 | Jamneala et al. |
| 7,400,217 | B2 | | 7/2008 | Larson, III et al. |
| 7,535,324 | B2 | | 5/2009 | Fattinger et al. |
| 7,550,900 | B2 | * | 6/2009 | Bouche et al. ............... 310/327 |
| 7,629,865 | B2 | | 12/2009 | Ruby |
| 2006/0119453 | A1 | | 6/2006 | Fattinger et al. |
| 2007/0035364 | A1 | | 2/2007 | Sridhar et al. |
| 2007/0205850 | A1 | | 9/2007 | Jamneala et al. |
| 2008/0297278 | A1 | | 12/2008 | Handtmann et al. |
| 2008/0297279 | A1 | | 12/2008 | Thalhammer et al. |
| 2009/0096550 | A1 | | 4/2009 | Handtmann et al. |
| 2009/0261922 | A1 | * | 10/2009 | Umeda ........................ 333/189 |
| 2010/0052470 | A1 | * | 3/2010 | Andle et al. ............... 310/313 A |

OTHER PUBLICATIONS

C.M.M. Denisse, et al. "Plasma-enhanced growth and composition of silicon oxynitride films", J. Appl. Phys., Oct. 1, 1986, p. 2536-2542, vol. 60, No. 7.

J.E. Schoenholz, et al. "Plasma-enhanced deposition of silicon oxynitride films", Thin Solid Films, 1987, p. 285-291.

(Continued)

*Primary Examiner* — Barbara Summons

(57) ABSTRACT

In accordance with a representative embodiment, a BAW resonator structure comprises: a first BAW resonator comprising a first lower electrode, a first upper electrode and a first piezoelectric layer disposed between the first lower electrode and the first upper electrode; and a second BAW resonator comprising a second lower electrode, a second upper electrode and a second piezoelectric layer disposed between the second lower electrode and the second upper electrode. The BAW resonator structure also comprises a single-material acoustic coupling layer disposed between the first and second BAW resonators. The single-material acoustic coupling layer comprises an inhomogeneous acoustic property across a thickness of the single-material acoustic coupling layer.

22 Claims, 6 Drawing Sheets

OTHER PUBLICATIONS

Tiberiu Jamneala, et al. "Ultra-Miniature Coupled Resonator Filter with Single-Layer Acoustic Coupler", IEEE Transactions on Ultrasonics, Ferroelectrics, and Frequency Control, Nov. 2009, p. 2553-2558, vol. 56, No. 11.

M.K. Small, et al. "A de-coupled stacked bulk acoustic resonator (DSBAR) filter with 2 dB bandwidth >4%", 2007 IEEE Ultrasonics Symposium, p. 604-607, Oct. 2007.

T. Jamneala, et al. "Coupled resonator filter with single-layer acoustic coupler", IEEE Transaction on Ultrasonics, Ferroelectrics, and Frequency Control, p. 2320-2326, vol. 55, Oct. 2008.

Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.

Fattinger, G.G. et al., "Single-To-Balance Filters for Mobile Phones Using Coupled Resonator BAW Technology", *2004 IEEE Ultrasonics Symposium* Aug. 2004, 416-419.

Fattinger, G. B. et al., "Spurious Mode Suppression in Coupled Resonator Filters", *IEEE MTT-S International Microwave Symposium Digest* 2005, 409-412.

Gilbert, S. R. , "An Ultra-Miniature, Low Cost Single Ended to Differential Filter for ISM Band Applications", *Micro. Symp. Digest*, 2008 IEEE MTT-S Jun. 2008, 839-842.

Grill, A. et al., "Ultralow-K Dielectrics Prepared by Plasma-Enhanced Chemical Vapor Deposition", *App. Phys. Lett*, vol. 79 No. 6, Aug. 2001, pp. 803-805.

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Kaitila, J. et al., "Measurement of Acoustical Parameters of Thin Films", *2006 IEEE Ultrasonics Symposium* Oct. 2006, 464-467.

Lakin, K.M. , "Bulk Acoustic Wave Coupled Resonator Filters", *2002 IEEE International Frequency Control Symposium and PDA Exhibition* May 2002, 8-14.

Lakin, K.M. , "Coupled Resonator Filters", *2002 IEEE Ultrasonics Symposium* Mar. 2, 2002, 901-908.

Loboda, M. J. , "New Solutions for Intermetal Dielectrics Using Trimethylsilane-Based PECVD Processes", *Microelectronics Eng.*, vol. 50. 2000, 15-23.

Shirakawa, A. A. et al., "Bulk Acoustic Wave Coupled Resonator Filters Synthesis Methodology", *2005 European Microwave Conference*, vol. 1 Oct. 2005.

Thomsen, C. et al., "Surface Generation and Detection of Phonons by Picosecond Light Pulses", *Phys. Rev. B*, vol. 34 No. 6, Sep. 15, 1986, pp. 4129-4138.

\* cited by examiner

BULK ACOUSTIC RESONATOR STRUCTURES COMPRISING A SINGLE MATERIAL ACOUSTIC COUPLING LAYER COMPRISING INHOMOGENEOUS ACOUSTIC PROPERTY

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of many components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials and the thicknesses of the layers in the acoustic stack. One type of BAW resonator comprises a piezoelectric film for the piezoelectric material. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to certain known resonators.

FBARs may comprise a membrane (also referred to as the acoustic stack) disposed over air. Often, such a structure comprises the membrane suspended over a cavity provided in a substrate over which the membrane is suspended. In other FBARs the acoustic stack is disposed over an acoustic mirror formed in the substrate. Regardless of whether the acoustic stack is suspended over air or provided over an acoustic mirror, the acoustic stack comprises a piezoelectric layer disposed over a first electrode, and a second electrode disposed over the piezoelectric layer.

Filters based on FBAR technology provide a comparatively low in-band insertion loss due to the comparatively high quality (Q) factor of FBAR devices. FBAR-based filters are often employed in cellular or mobile telephones that can operate in multiple frequency bands. In such devices, it is important that a filter intended to pass one particular frequency band ("the passband") should have a high level of attenuation at other nearby frequency bands which contain signals that should be rejected. Specifically, there may be one or more frequencies or frequency bands near the passband which contain signals at relatively high amplitudes that should be rejected by the filter. In such cases, it would be beneficial to be able to increase the filter's rejection characteristics at those particular frequencies or frequency bands, even if the rejection at other frequencies or frequency bands does not receive the same level of rejection.

One type of filter based on FBAR technology is known as a coupled resonator filter (CRF). A CRF comprises a coupling structure disposed between two vertically stacked FBARs. The CRF combines the acoustic action of the two FBARs, which leads to a bandpass filter transfer function. For a given acoustic stack, the CRF has two fundamental resonance modes, a symmetric mode and an asymmetric mode, of different frequencies. The degree of difference in the frequencies of the modes depends, inter alia, on the degree or strength of the coupling between the two FBARs of the CRF. If the degree of coupling between the two FBARs is too great, the passband is unacceptably wide, and an unacceptable 'swag' or 'dip' in the center of the passband results, as does an attendant unacceptably high insertion loss in the center of the passband.

The spreading of the passband, and the swag in the center of the passband, has lead efforts to reduce the degree of coupling between the FBARs of the CRF. For many known materials useful for acoustic coupling, the degree of coupling is too great, and results in an unacceptably high difference in the resonance frequencies of the modes of the CRF. One technique used to reduce the degree of coupling between the FBARs of the CRF involves the use a coupling structure comprising a plurality of coupling layers with alternating acoustic impedance. At each interface between each coupling layer a partial reflection of the acoustic mode occurs. The multiple interfaces provide an additive effect, and the degree of coupling between the FBARs is beneficially reduced. While coupling structures comprising a plurality of coupling layers facilitate decoupling of the FBARs in the CRF, their fabrication adds complexity to the fabrication process, and ultimately the cost of the resultant product.

Another technique aimed at reducing the degree of coupling between the FBARs of the CRF involves the use of certain comparatively low acoustic impedance materials, such as silicon low-k (SiLK) resin, which is known to one of ordinary skill in the art. While the use of these known low acoustic impedance materials shows promise from the perspective of reduced coupling between FBARs in the CRF, and thereby improved passband characteristics, such known materials exhibit an unacceptably high acoustic attenuation resulting in an unacceptable degree of acoustic loss, and an undesirable reduction in Q.

What is needed, therefore, is a CRF and method of fabrication that overcomes at least the known shortcomings described above.

SUMMARY

In accordance with a representative embodiment, a BAW resonator structure comprises a first BAW resonator comprising a first lower electrode, a first upper electrode and a first piezoelectric layer disposed between the first lower electrode and the first upper electrode; and a second BAW resonator comprising a second lower electrode, a second upper electrode and a second piezoelectric layer disposed between the second lower electrode and the second upper electrode. The BAW resonator structure also comprises a single-material acoustic coupling layer disposed between the first and second BAW resonators. The acoustic coupling layer comprises an inhomogeneous acoustic property across its thickness.

In accordance with another representative embodiment, a method of fabricating a bulk acoustic wave (BAW) resonator structure comprises forming a first BAW resonator; forming a second BAW resonator; and forming a single-material acoustic coupling layer between the first BAW resonator and the second BAW resonator. The single-material acoustic coupling layer comprises an inhomogeneous acoustic property across its thickness.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
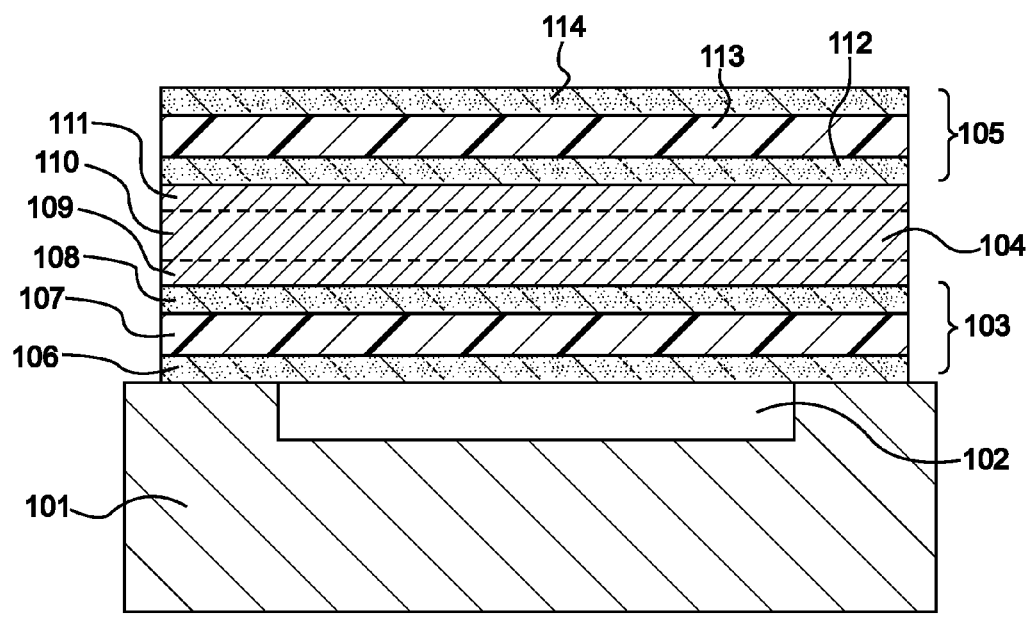
FIG. 1A is a cross-sectional view of a BAW resonator structure in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate to FBAR devices (FBARs), FBAR-based filters (e.g., CRFs), their materials and their methods of fabrication. Certain details of FBARs, FBAR-based filters, materials thereof and their methods of fabrication may be found in one or more of the following U.S. Patents and Patent Applications: U.S. Pat. No. 6,107,721, to Lakin; U.S. Pat. Nos. 5,587,620, 5,873,153, 7,629,865 and 6,507,983 to Ruby, et al.; U.S. Pat. No. 7,629,865 to Richard C. Ruby; U.S. Pat. No. 7,280,007 to Hongjun Feng, et al.; and U.S. Patent Publication No. 20070205850 to Jamneala, et al.; and U.S. Pat. No. 7,388,454 to Richard C. Ruby, et al. The disclosures of these patents and patent applications are specifically incorporated herein by reference. It is emphasized that the components, materials and method of fabrication described in these patents and patent applications are merely illustrative and other methods of fabrication and materials within the purview of one of ordinary skill in the art are contemplated.

FIG. 1A is a cross-sectional view of a BAW resonator structure 100 in accordance with a representative embodiment. In the representative embodiments, the BAW resonator structure 100 is configured through appropriate electrical connections (not shown) to function as a CRF. It is noted that this is merely illustrative, and it is emphasized that other configurations for other applications of the present teachings are contemplated by appropriate electrical connections. For example, the BAW resonator structure 100 may be used to provide a single-to-balanced signal converter.

The BAW resonator structure 100 comprises a substrate 101 and a cavity 102 (often referred to as a 'swimming pool'). Alternatively, an acoustic mirror (not shown) comprising alternating layers of high and low acoustic impedance may be formed in the substrate 101 to provide acoustic isolation. The BAW resonator structure 100 comprises a first BAW resonator 103 disposed over the cavity 102; and a single-material acoustic coupling layer 104 is disposed over the first BAW resonator 103. The BAW resonator structure 100 comprises a second BAW resonator 105, which is disposed over the single-material acoustic coupling layer 104. The first BAW resonator 103 comprises a first lower electrode 106, a first piezoelectric layer 107 and a first upper electrode 108. The second BAW resonator 105 comprises a second lower electrode 112, a second piezoelectric layer 113 and a second upper electrode 114 in sequence as shown. As described more fully below, the single-material acoustic coupling layer 104 comprises an inhomogeneous acoustic property across its thickness. In a representative embodiment, the acoustic property is the acoustic impedance. In certain embodiments the single-material acoustic coupling layer has an inhomogeneous mass density across its thickness.

In the embodiment depicted, the single-material acoustic coupling layer 104 comprises a first region 109, a second region 111, and a third region 110 between the first and second regions 109, 111. Illustratively, the acoustic property in each of these regions 109, 110, 111 is selected to improve the passband characteristic of a CRF comprising the BAW resonator structure 100. For example, and as described more fully below, the respective acoustic impedances of the first, second and third regions 109~111 are tailored to improve the passband characteristics of the CRF. It is emphasized that inclusion of three regions the single material acoustic coupling layer 104 is merely illustrative. More generally, in accordance with representative embodiments the single-material acoustic coupling layer 104 comprising an inhomogeneous acoustic property across its thickness comprises two or more regions with differing selected acoustic properties.

The BAW resonator structure 100 is fabricated by forming the first BAW resonator 103; forming the second BAW resonator 105; and forming the single-material acoustic coupling layer 104 between the first BAW resonator 103 and the second BAW resonator 105. The fabrication of the first and second BAW resonators 103, 105, as well as the cavity 102 (or acoustic mirror) are effected using known materials and processing methods, such as described in the incorporated patents and patent applications above. The single-material acoustic coupling layer 104 illustratively comprises one of silicon oxynitride ($SiO_xN_y$) or carbon-doped silicon oxide (SiOC) fabricated to provide the desired inhomogeneous acoustic property across its thickness. The details of the fabrication of an SiOC layer comprising an inhomogeneous acoustic property across its thickness are disclosed in commonly owned co-pending U.S. Patent Publication No. 20110204996 filed on even date herewith and entitled "Acoustic Coupling Layer for Coupled Resonator Filters and Method of Fabricating Acoustic Coupling Layer" to Steven Gilbert, et al. The disclosure of this patent publication is specifically incorporated herein by reference. The details of fabrication of a silicon oxynitride layer comprising an inhomogeneous acoustic property across its thickness are disclosed for example in "Plasma-Enhanced Growth and Composition of Silicon Oxynitride films," J. Appl. Phys. 60, p. 2536-2542, 1986 to C. M. M. Denisse; and "Plasma-Enhanced Deposition of Silicon Oxynitride Films, Thin Solid Films, 148, p. 285-291, 1987, to J. E. Schoenholz and D. W. Hess. The disclosures of these references are specifically incorporated herein by reference.

Figure 1B:
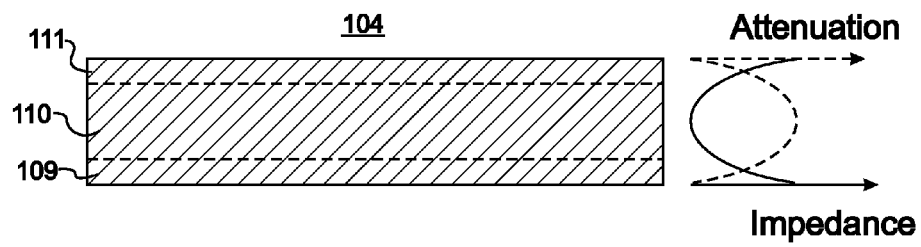
FIG. 1B is a cross-sectional view of a single-material acoustic coupling layer in accordance with a representative embodiment.

FIG. 1B is a cross-sectional view of the single-material acoustic coupling layer 104 in accordance with a representative embodiment. In the presently described embodiment, the acoustic impedance and the acoustic attenuation vary over the thickness of the single-material acoustic coupling layer 104. Specifically, the magnitude of the acoustic impedance (shown as the solid line) is comparatively high at the top and bottom of the layer (e.g., at the interface of the second lower electrode 112 and the first upper electrode 108, respectively), and gradually decreases toward the center of the single-material acoustic coupling layer 104. Thus, in the first and second regions 109, 111, the acoustic impedance is comparatively high, and the acoustic attenuation (dashed line) is comparatively low. In the third region 110, the acoustic impedance is comparatively low decreasing as shown toward the center of the third region 110. As such, the acoustic attenuation is comparatively high increasing as shown toward the center of the third region 110. It is emphasized that the profile of the acoustic impedance across the thickness of single-material acoustic coupling layer 104 depicted in FIG. 1B is merely illustrative. Notably, the gradient of the profile may be comparatively 'smooth' (e.g., as shown in FIG. 1B), or may be a step-function with a comparatively discrete change(s) in the acoustic impedance to form regions of low and high acoustic impedance or other selected acoustic property (also referred to as a stepwise variation). Moreover, substantially symmetric profile of the acoustic impedance across the thickness of the single-material acoustic coupling layer 104 is also merely illustrative, and profiles of the acoustic impedance across the thickness of the single-material acoustic coupling layer 104 that do not exhibit symmetry are also contemplated. Regardless of the profile of the acoustic impedance selected, it is believed that continuous partial reflections at the acoustic impedance gradients within the single-material coupling layer 104 comprising an inhomogeneous acoustic impedance of the representative embodiments provides the single-material acoustic coupling layer 104 with a comparatively lower effective acoustic impedance, while at the same time not substantially increasing the acoustic attenuation. As described more fully below, the degree of decoupling of the first and second resonators 103,105, respectively, is reduced, thereby reducing the bandwidth of the BAW resonator structure 100; and the overall acoustic loss of the BAW resonator structure 100 is reduced, thereby improving the insertion loss of the BAW resonator structure 100.

Generally, and as described more fully below in connection with specific embodiments below, a reduction in acoustic loss and an improvement in the passband characteristics can be realized by providing a comparatively high acoustic impedance (i.e., a comparatively low acoustic loss) where the stress from the symmetric resonant mode, or the asymmetric resonant mode, or both, of the BAW resonator structure 100 is comparatively large in the single-material acoustic coupling layer 104; and providing a comparatively low acoustic impedance (i.e., comparatively high acoustic loss) where the stress from the symmetric resonant mode, or the asymmetric resonant mode, or both, is comparatively small in the single-material acoustic coupling layer 104. Ultimately, the selection of the regions of high acoustic impedance and low acoustic impedance (i.e., the profile of the acoustic impedance across the single-material acoustic coupling layer 104) of the present teachings are a trade-off between a desired degree of coupling of the first and second BAW resonators 103, 105, and the degree of acceptable insertion loss of the BAW resonator structure 100. To this end, a greater degree of decoupling can be realized from a comparatively low acoustic impedance (higher acoustic attenuation) material in the single-material acoustic coupling layer 104; and a lesser degree of acoustic loss can be realized from a comparatively high acoustic impedance (lower acoustic attenuation) material in the single-material acoustic coupling layer 104. Thus, the present teachings provide for tailoring of the acoustic impedance across the single-material acoustic coupling layer 104 to reduce passband spreading and reduce the 'swag' or 'dip' in the center of the passband as desired.

Figure 1C:
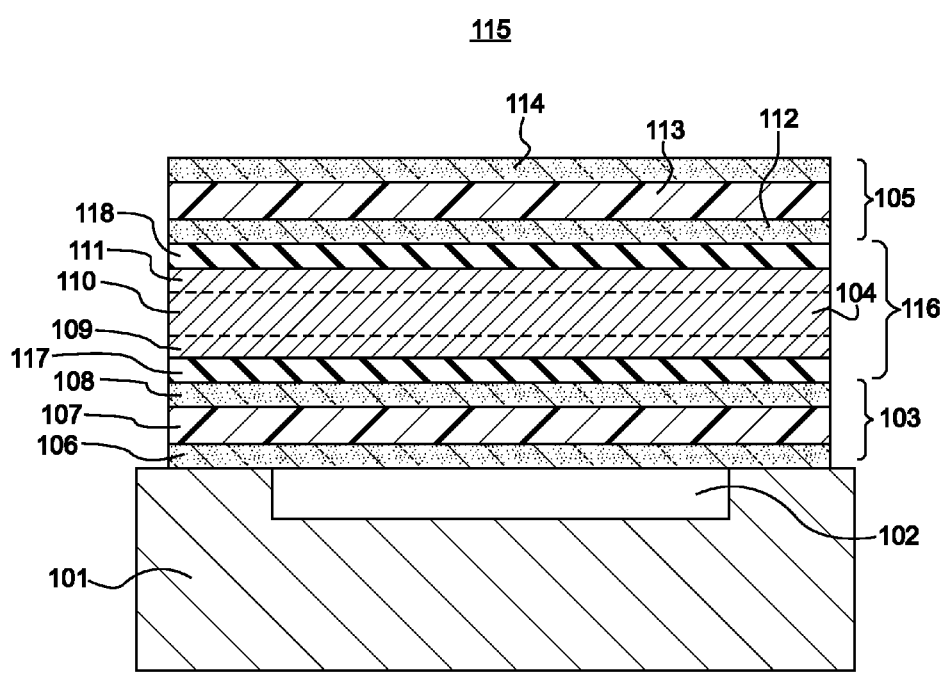
FIG. 1C is a cross-sectional view of a single-material acoustic coupling layer in accordance with a representative embodiment.

FIG. 1C is a cross-sectional view of a BAW resonator structure 115 in accordance with a representative embodiment. The BAW resonator structure 115 shares many common features with the BAW resonator structure 100 described above. Such common features are generally not repeated in order to avoid obscuring the description of the representative embodiment set forth in FIG. 1C. The BAW resonator structure 115 comprises an acoustic coupling structure 116, comprising single-material acoustic coupling layer 104 comprising an inhomogeneous acoustic impedance, and at least one other layer. The acoustic coupling structure 116 is disposed over the first BAW resonator 103 and beneath the second BAW resonator 105. In the representative embodiment shown in FIG. 1C, the acoustic coupling structure 116 comprises a first acoustic coupling layer 117 disposed beneath the single-material acoustic coupling layer 104; and a second acoustic coupling layer 118 disposed over the single-material acoustic coupling layer 104. Illustratively, the first acoustic coupling layer 117 and the second acoustic coupling layer 118 each comprise a substantially homogeneous acoustic impedance across their respective thicknesses. In another representative embodiment, in addition to the single-material acoustic coupling layer 104 comprising an inhomogeneous acoustic impedance, one or both of the first and second acoustic coupling layers 117, 118 of the acoustic coupling structure 116 comprise an inhomogeneous acoustic impedance across their respective thicknesses. In such an embodiment, one or both of the first and second acoustic coupling layers 117, 118 would comprise the same material as and be fabricated in a substantially identical manner as the single-material acoustic coupling layer 104.

In a representative embodiment, the first acoustic coupling layer 117 and the second acoustic coupling layer 118 comprise the same material. However, the first acoustic coupling layer 117 and the second acoustic coupling layer 118 comprise different materials. Illustratively the he first acoustic coupling layer 117 and the second acoustic coupling layer 118 comprise silicon dioxide ($SiO_2$), or silicon nitride ($SiN_x$), or a doped material such as phosphosilicate glass (PSG) or borosilicate glass (BSG). Furthermore, it is noted that in addition to the single-material acoustic coupling layer 104 comprising an inhomogeneous acoustic impedance, the acoustic coupling structure 116 may comprise more or fewer layers than the first and second acoustic coupling layers 117, 118 shown in FIG. 1C. In an embodiment where the acoustic coupling structure 116 comprises more than first and second acoustic coupling layers 117, 118, the additional acoustic coupling layers comprise one of the illustrative materials referenced above.

Figure 2A:
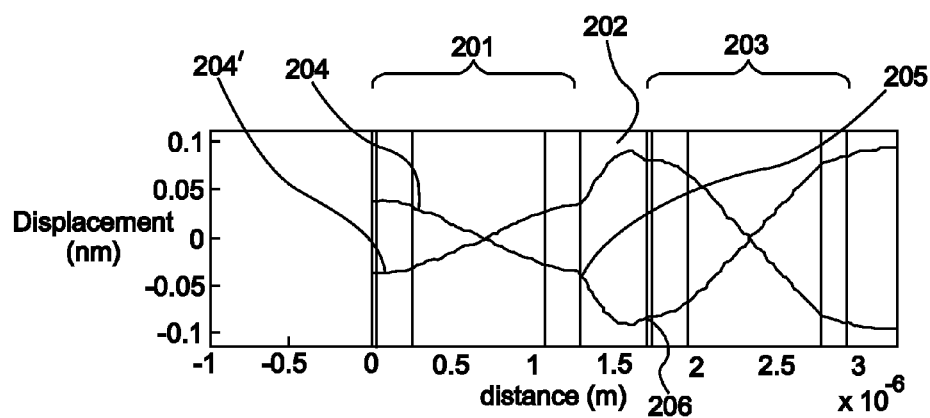
FIG. 2A is a graphical representation of displacement caused by a symmetrical mode of a BAW resonator structure in accordance with a representative embodiment.

FIG. 2A is a graphical representation of displacement caused by a symmetrical (first resonance) mode of a BAW resonator structure in accordance with a representative embodiment. To facilitate the description, a BAW resonator structure is superposed over the graph of displacement versus distance. In particular, a first BAW resonator 201, an acoustic coupling layer 202, and a second BAW resonator 203 are depicted. Notably, the acoustic coupling layer 202 may comprises a single-material acoustic coupling layer comprising an inhomogeneous acoustic impedance in accordance with a representative embodiment. As described more fully below, the profile of the acoustic impedance across the thickness of the coupling layer is selected to improve passband characteristics of the BAW resonator structure comprising first BAW resonator 201 and second BAW resonator 203.

Curves 204, 204' (of opposite phase) depict the displacement caused by the symmetrical mode at each point of the BAW resonator structure. For ease of discussion the displacement of only one phase is described with reference to curve 204. As shown, the displacement is comparatively great in the center of the acoustic coupling layer 202, and comparatively low at the respective interfaces of the acoustic coupling layer 202 and the first and second BAW resonators 201, 203.

Figure 2B:
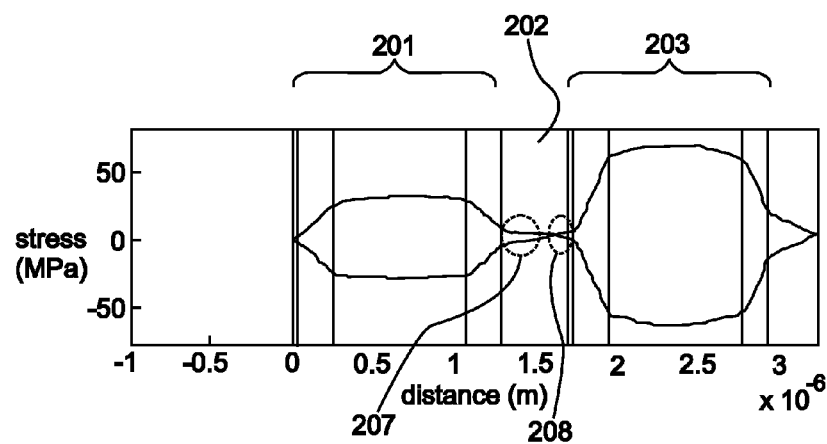
FIG. 2B is a graphical representation of stress caused by a symmetrical mode of a BAW resonator structure in accordance with a representative embodiment.

FIG. 2B depicts the stress within the BAW resonator structure of the symmetrical mode. Notably, toward the center of the acoustic coupling layer 202, the stress is essentially zero. However, toward the interfaces between the acoustic coupling layer 202 and the first and second BAW resonators 201, 203, the stress is greater, as shown at regions 207, 208 of the acoustic coupling layer 202. In accordance with a representative embodiment, the acoustic impedance of the acoustic coupling layer 202 may be tailored to be comparatively high (and thereby the acoustic attenuation comparatively low) in regions near the respective interfaces of the acoustic coupling layer 202 and the first and second BAW resonators 201, 203. As such, in regions shown at 207, 208 the local acoustic attenuation can be reduced by providing a comparatively increased acoustic impedance at regions 207, 208, and thereby a comparatively lower acoustic loss in these regions can be realized. Furthermore, as shown in FIG. 2B, at a point between regions 207 and 208 of the acoustic coupling layer 202, the stress is essentially zero.

As such, the acoustic impedance of the acoustic coupling layer 202 can be comparatively low (and therefore the acoustic attenuation comparatively high) to substantially coincide with the comparatively low stress in the acoustic coupling layer 202 at this location. Thus, in a representative embodiment, across the thickness of the acoustic coupling layer 202, the acoustic impedance profile comprises a comparatively high acoustic impedance near the interfaces of the acoustic coupling layer 202 and first and second BAW resonators 201, 203, respectively; and a comparatively low acoustic impedance near the center of the acoustic coupling layer 202. Among other benefits, and as described in more detail below, the degree of coupling of the first and second BAW resonators 201, 203 can be reduced and a reduced overall acoustic loss can be realized by tailoring the acoustic impedance of the acoustic coupling layer 202 to be comparatively high (i.e., the acoustic attenuation is comparatively low) where the stress is comparatively high in the acoustic coupling layer 202 (e.g., regions 207, 208), and by tailoring the acoustic impedance of the acoustic coupling layer 202 to be comparatively low (i.e., the acoustic attenuation is comparatively high) where stress is comparatively low in the acoustic coupling layer 202.

Figure 2C:
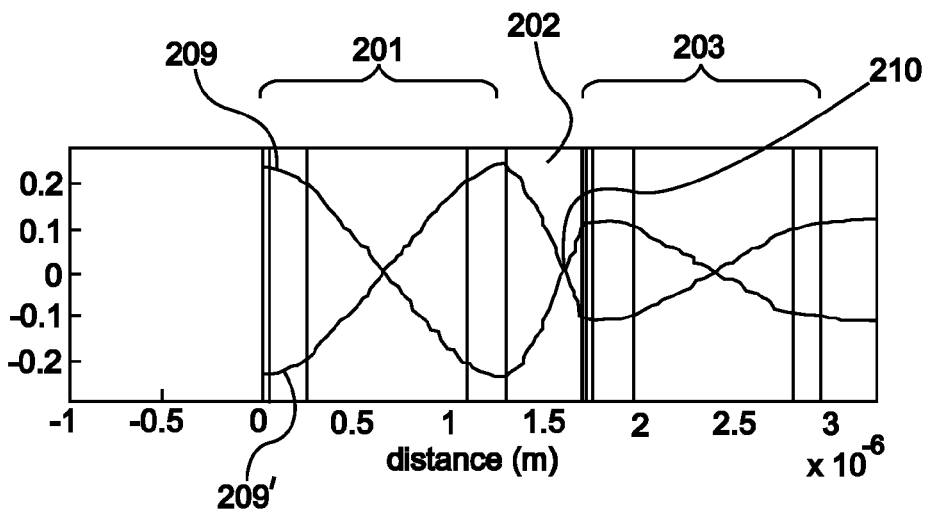
FIG. 2C is a graphical representation of displacement caused by an asymmetrical mode of a BAW resonator structure in accordance with a representative embodiment.

FIG. 2C is a graphical representation of displacement caused by an asymmetrical (second resonance) mode of a BAW resonator structure in accordance with a representative embodiment. Again, to facilitate the description, a BAW resonator structure is superposed over the graph of displacement versus distance. In particular, first BAW resonator 201, acoustic coupling layer 202, and second BAW resonator 203 are depicted. Curves 209, 209' (of opposite phase) depict the displacement caused by the symmetrical mode at each point of the BAW resonator structure. For ease of discussion the displacement of only one phase is described with reference to curve 209. As shown, the displacement is essentially zero at region 210 near the center of the acoustic coupling layer 202, and comparatively high at the respective interfaces of the acoustic coupling layer 202 and the first and second BAW resonators 201, 203, respectively.

Figure 2D:
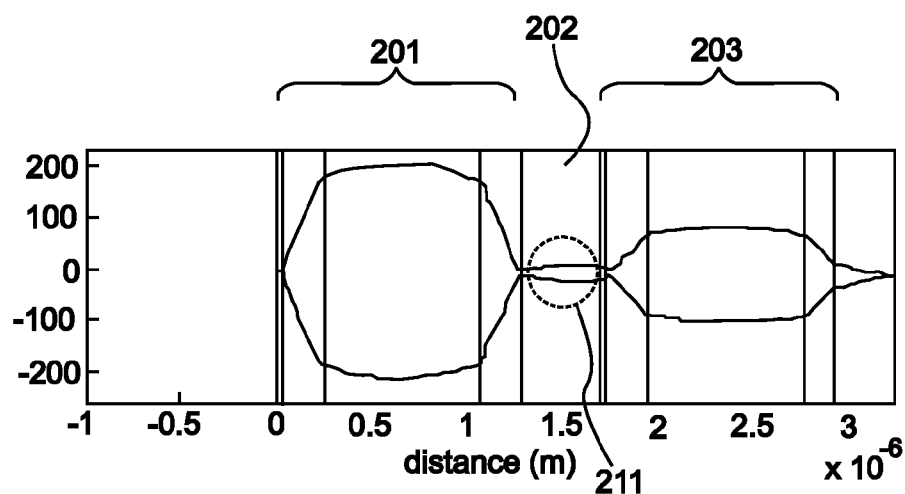
FIG. 2D is a graphical representation of stress caused by an asymmetrical mode of a BAW resonator structure in accordance with a representative embodiment.

FIG. 2D depicts the stress within the resonator structure of the symmetrical mode. Notably, toward the center of the acoustic coupling layer 202, the stress is comparatively large, and closer to the interfaces between the acoustic coupling layer 202 and the first and second BAW resonators 201, 203, the stress is comparatively low. In accordance with a representative embodiment, the acoustic impedance of the acoustic coupling layer 202 may be selected to be comparatively high at the center of acoustic coupling layer 202 and comparatively low at the interfaces of the acoustic coupling layer 202 and the first and second BAW resonators 201, 203. As such, in region 211 the local acoustic attenuation of the acoustic coupling layer 202 can be reduced by providing a comparatively increased acoustic impedance at region 211, and thereby realizing a comparatively lower acoustic loss in these regions. Furthermore, because the stress is comparatively low at the interfaces between the acoustic coupling layer 202 and the first and second BAW resonators 201, 203, the acoustic impedance of the acoustic coupling layer 202 of the representative embodiment selected to be comparatively low (and therefore the acoustic attenuation comparatively high) to substantially coincide with the comparatively low stress in the acoustic coupling layer 202 at this location. As such, the acoustic coupling of the first and second BAW resonators 201, 203, can be reduced without significantly increasing the overall acoustic loss of the BAW resonator structure.

As can be appreciated from a review of the stress in the acoustic coupling layer 202 in FIGS. 2B and 2D, the stress caused by the symmetric mode is greater closer to the interfaces of the acoustic coupling layer 202 and the first and second BAW resonators 201, 203; and the stress caused by the asymmetric mode is greater at the center of the acoustic coupling layer 202. Accordingly, a tradeoff can be made in the selection of the acoustic impedance profile across the thickness of the acoustic coupling layer 202 to reduce the overall acoustic loss in the BAW resonator structure. In a representative embodiment, because the stress caused by the asymmetric mode in region 211 is comparatively larger than the stress caused by the symmetric mode in regions 207, 208, the acoustic impedance in the acoustic coupling layer 202 is beneficially tailored to be comparatively high (comparatively low acoustic loss) toward the center of the coupling layer (corresponding to region 211), and comparatively low (comparatively high acoustic loss) toward the interfaces (corresponding to regions 207, 208) of the acoustic coupling layer 202 and the first and second BAW resonators 201, 203. Further details of the resultant passband of a BAW resonator structure comprising acoustic coupling layer 202 with comparatively higher acoustic impedance toward the center and comparatively lower impedance toward the interfaces are described presently in connection with FIG. 3.

Figure 3:
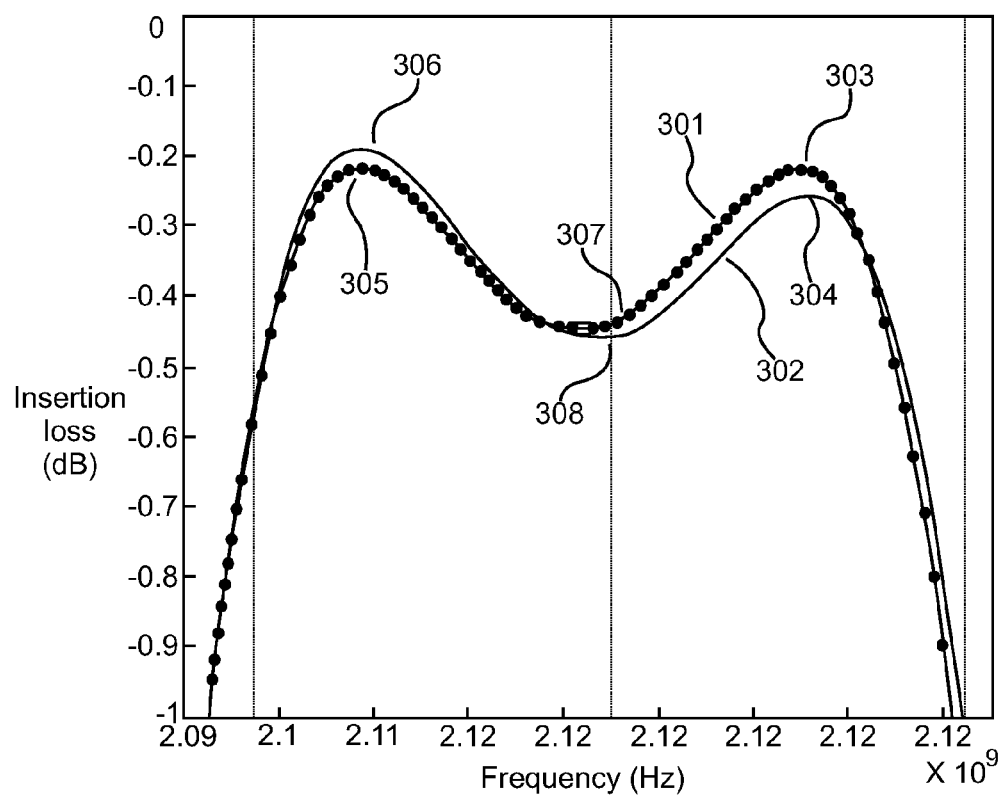
FIG. 3 is a graphical representation of a passband of a BAW resonator in accordance with a representative embodiment.

FIG. 3 is a graphical representation of a passband 301 of a BAW resonator structure (e.g., BAW resonator structure 100) in accordance with a representative embodiment. For purposes of comparison, a passband 302 of a known homogeneous coupling layer with a reduced overall acoustic impedance in a similar BAW resonator is shown. The impedance of the homogeneous coupling layer has been chosen to get the desired bandwidth. As a result of choosing the impedance of the coupling layer, there is a particular attenuation of this kind of homogeneous coupling layer. Initially, it is noted that the bandwidth of the passbands 301, 302 is substantially the same, with the bandwidth of passband 301 being slightly less than that of passband 302.

The insertion loss at the second resonance frequency (asymmetric mode) of the BAW resonator structure comprising a single-material acoustic coupling layer comprising an inhomogeneous acoustic impedance across its thickness is depicted at point 303 of the passband 301. Notably, the acoustic impedance toward the center (i.e., in region 211 where the stress is comparatively high) of the acoustic coupling layer 202 is comparatively high; and thereby the acoustic attenuation toward the center of the acoustic coupling layer 202 is comparatively low. As such, the insertion loss of a BAW resonator structure of the present representative embodiment comprising a single-material acoustic coupling layer with an inhomogeneous acoustic impedance profile is comparatively low. By contrast, the insertion loss at the second resonance frequency of a BAW resonator comprising a homogeneous coupling layer is depicted at point 304. As can be seen from a comparison of passbands 301 and 302, without the tailored acoustic impedance profile of the representative embodiment in the acoustic coupling layer 202, the acoustic attenuation is greater at the region 211 where stress is greater, and the insertion loss at the second resonance frequency is worse in the BAW resonator structure with a homogeneous acoustic coupling layer.

As described to above, a tradeoff can be made in the selection of the acoustic impedance profile across the thickness of the acoustic coupling layer 202 to reduce the overall acoustic loss in the BAW resonator structure. In the representative embodiment this requires the acoustic impedance of the acoustic coupling layer 202 to be comparatively low (i.e., comparatively high acoustic attenuation) toward the interfaces (corresponding to regions 207, 208 in FIG. 2B) of the acoustic coupling layer 202 and the first and second BAW resonators 201, 203. Because the acoustic impedance at the interfaces is comparatively low, and the stress caused by the symmetric mode in regions 207, 208, the insertion loss (depicted at point 305) at the first resonance where the stress is comparatively high. Notably, the insertion loss (depicted at point 306) at the first resonance frequency in a BAW resonator comprising a homogeneous coupling layer is slightly better than is realized by a BAW resonator structure of the representative embodiment comprising a single-material acoustic coupling layer comprising an inhomogeneous acoustic impedance across its thickness. However, the improvement in the insertion loss at the second resonance frequency (point 303) of a BAW resonator structure of the representative embodiment comprising a single-material acoustic coupling layer with an inhomogeneous acoustic impedance is greater than the degradation of the insertion loss at the first resonance frequency (point 305). As such, the overall acoustic loss of passband 301 is improved compared to the overall acoustic loss of the passband 302.

Finally, as the overall losses are reduced, meaning the improvement at the second resonance is greater than the degradation at the first resonance, the insertion loss at the 'dip' (depicted at point 307) in the passband 301 is improved when compared to the insertion loss at the 'dip' (depicted at point 308) of a the passband 302 of a BAW resonator structure having a homogeneous coupling layer.

Figure 4:
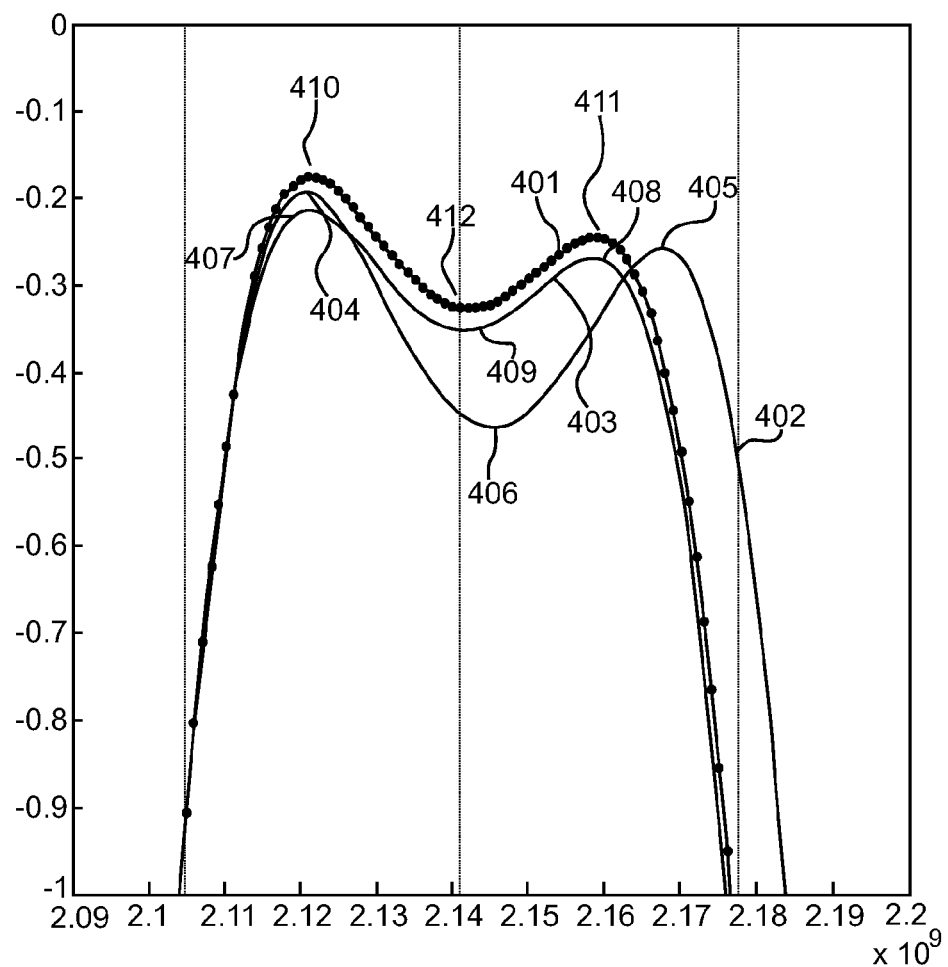
FIG. 4 is a graphical representation of a passband of a BAW resonator in accordance with a representative embodiment.

FIG. 4 is a graphical representation of a passband 401 of a BAW resonator structure (e.g., BAW resonator structure 100) comprising a single-material coupling layer comprising an inhomogeneous acoustic impedance in accordance with a representative embodiment. For purposes of comparison, a passband 402 of a known BAW resonator structure in which the coupling of the BAW resonators is unacceptably high is depicted; and a passband 403 of another known BAW resonator structure comprising a homogeneous acoustic coupling layer is depicted.

The passband 402 is unacceptable for two reasons. First, the frequency difference between the two resonance peaks (depicted at points 404, 405) is too great, and results from unacceptably high acoustic coupling. Moreover, because of the unacceptably high acoustic coupling of the BAW resonators, the insertion loss at a 'dip' 406 is unacceptably high.

The passband 403 results from a resonator with a homogeneous coupling layer where the impedance of the coupling layer has been reduced as compared to the impedance of the coupling layer of the resonator that produces passband 402. Consequently, the bandwidth and frequency difference between the two resonance peaks (depicted at points 407, 408) are reduced compared to passband 402. Notably, the homogeneous acoustic coupling layer results in reduced acoustic coupling between the resonators, and an overall reduction in the bandwidth. Furthermore, the insertion loss at a 'dip' 409 is also improved compared to dip 406 of passband 402.

The passband 401 BAW resonator structure of a representative embodiment comprising a single-material coupling layer comprising an inhomogeneous acoustic impedance is improved compared to both passbands 402, 403. Notably, in the representative embodiment the coupling layer comprises a comparatively low acoustic impedance toward a center of the layer (e.g., in third region 110 of single-material acoustic coupling layer 104 in FIG. 1), and an overall comparatively high acoustic attenuation with the profile of the acoustic impedance of the single-material acoustic coupling layer being determined by stress in the coupling layer caused by the first and second resonance modes of the BAW resonator structure. The passband 401 shows a reduction in the bandwidth and frequency difference between the two resonance peaks (depicted at points 410, 411) compared to passband 402, and substantially the same bandwidth and difference between resonance peaks as passband 403. However, because of the overall reduction in the acoustic losses compared to the known BAW resonator structures comprising a homogeneous coupling layer, the BAW resonator structure of the representative embodiment comprising a single material acoustic coupling layer having an inhomogeneous acoustic impedance across its thickness exhibits a reduced degree of acoustic coupling between BAW resonators. Thereby, the insertion loss at the 'dip' 412 is reduced compared to the insertion loss at 'dips' 406, 409 of passbands 402, 403. However, as the overall acoustic losses BAW resonator of the representative embodiment comprising a single material acoustic coupling layer having an inhomogeneous acoustic impedance across its thickness are lower compared to the known BAW resonator structures, the passband 401 is superior to the passband 402 and 403, particularly the dip 412 is reduced compared to the dips 409 and 406.

In accordance with illustrative embodiments, BAW resonator structures comprising a single-material inhomogeneous acoustic coupling layer and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A BAW resonator structure, comprising:
a first BAW resonator comprising a first lower electrode, a first upper electrode and a first piezoelectric layer disposed between the first lower electrode and the first upper electrode;
a second BAW resonator comprising a second lower electrode, a second upper electrode and a second piezoelectric layer disposed between the second lower electrode and the second upper electrode; and
a single-material acoustic coupling layer disposed between the first and second BAW resonators, the single-material acoustic coupling layer comprising an inhomogeneous acoustic property across a thickness of the acoustic coupling layer.

2. A BAW resonator structure as claimed in claim 1, wherein the single-material acoustic coupling layer comprises an inhomogeneous mass density across its thickness.

3. A BAW resonator structure as claimed in claim 1, wherein the inhomogeneous acoustic property is an acoustic impedance.

4. A BAW resonator structure as claimed in claim 1, wherein the inhomogeneous acoustic property is an acoustic attenuation.

5. A BAW resonator structure as claimed in claim 1, wherein the single-material acoustic coupling layer comprises a first region adjacent to the first upper electrode, a second region adjacent to the second lower electrode, and a third region between the first region and the second region, wherein the acoustic property in the third region is different than the respective acoustic properties at either the first region or the second region, or both.

6. A BAW resonator structure as claimed in claim 5, wherein the inhomogeneous acoustic property is an acoustic impedance.

7. A BAW resonator structure as claimed in claim 5, wherein the single-material acoustic coupling layer comprises an inhomogeneous mass density across its thickness.

8. A BAW resonator structure as claimed in claim 5, wherein the inhomogeneous acoustic property is an acoustic attenuation.

9. A BAW resonator structure as claimed in claim 1, wherein the single-material acoustic coupling layer comprises one of silicon oxynitride (SiON) or carbon-doped silicon oxide (SiOC).

10. A BAW resonator structure as claimed in claim 1, wherein the inhomogeneous acoustic property has a finite gradient across the thickness of the single-material acoustic coupling layer.

11. A BAW resonator structure as claimed in claim 1, wherein the inhomogeneous acoustic property has a stepwise variation across the thickness of the single-material acoustic coupling layer.

12. A BAW resonator structure as claimed in claim 1, further comprising an acoustic coupling structure disposed between the first and second BAW resonators, the acoustic coupling structure comprising:
the single-material acoustic coupling layer; and
another acoustic coupling layer.

13. A BAW resonator structure as claimed in claim 12, wherein the other acoustic coupling layer comprises a substantially homogeneous acoustic property across a thickness thereof.

14. A BAW resonator structure as claimed in claim 12, wherein the other acoustic coupling layer comprises a substantially inhomogeneous acoustic property across a thickness thereof.

15. A method of fabricating a bulk acoustic wave (BAW) resonator, the method comprising:
forming a first BAW resonator;
forming an second BAW resonator; and
forming a single-material acoustic coupling layer between the first BAW resonator and the second BAW resonator, the single-material acoustic coupling layer comprising an inhomogeneous acoustic property across a thickness of the single-material acoustic coupling layer.

16. A method as claimed in claim 15, wherein the forming the single-material acoustic coupling layer further comprises depositing a first portion of the layer having a first value of an acoustic property and depositing a second portion of the layer having a second value of the acoustic property, the second value of the acoustic property being different than the first value of the acoustic property.

17. A method as claimed in claim 16, wherein a transition from the first portion to the second portion has a finite gradient.

18. A method as claimed in claim 16, wherein a transition from the first portion to the second portion has a stepwise variation.

19. A method as claimed in claim 15, wherein the single-material acoustic coupling layer comprises an inhomogeneous mass density across its thickness.

20. A method as claimed in claim 15, wherein the single-material acoustic coupling layer comprises a first region adjacent to a first upper electrode, a second region adjacent to a second lower electrode, and a third region between the first region and the second region, wherein the acoustic property in the third region is different than the respective acoustic properties at either the first region or the second region, or both.

21. A method as claimed in claim 15, wherein the inhomogeneous acoustic property is an acoustic attenuation.

22. A method as claimed in claim 15, wherein the single-material acoustic coupling layer comprises one of silicon oxynitride (SiON) or carbon-doped silicon oxide (SiOC).

* * * * *